(12) United States Patent
Rao et al.

(10) Patent No.: US 8,284,082 B2
(45) Date of Patent: Oct. 9, 2012

(54) DYNAMIC ENCODE SETTING ADJUSTMENT

(75) Inventors: Narayana Rao, Bangalore (IN); Satish Iyer, Bangalore (IN)

(73) Assignee: Sling Media Pvt. Ltd., Bangalore, IN (US)

( * ) Notice: Subject to any disclaimer, the term of this patent is extended or adjusted under 35 U.S.C. 154(b) by 58 days.

(21) Appl. No.: 12/913,625

(22) Filed: Oct. 27, 2010

(65) Prior Publication Data

US 2012/0106669 A1 May 3, 2012

(51) Int. Cl.
H03M 7/34 (2006.01)

(52) U.S. Cl. ..................... 341/51; 375/240.13

(58) Field of Classification Search .................. 341/51; 375/240.13, 240.12, 240.07, 240.05, 240.01, 375/240.02, 240.03, 240.26, 240.27; 725/116, 725/38, 105; 348/725, 731

See application file for complete search history.

(56) References Cited

U.S. PATENT DOCUMENTS

| 5,594,469 | A | 1/1997 | Freeman et al. |
| 6,191,773 | B1 | 2/2001 | Maruno et al. |
| 2008/0198929 | A1* | 8/2008 | Fujihara ................... 375/240.13 |
| 2009/0079813 | A1 | 3/2009 | Hildreth |
| 2009/0102800 | A1 | 4/2009 | Keenan |

OTHER PUBLICATIONS

International Search Report and Written Opinion dated Aug. 11, 2011, PCT/US2010/000085, 10 pages.
European Patent Office "International Search Report" mailed Aug. 19, 2011; International Appln. No. PCT/IN2011/000276, filed Apr. 26, 2011.
Sato, J. et al. "Compressed Video Transmission Protocol considering Dynamic QoS Control," Architectural and OS Support for Multimedia Applications/Flexible Communication Systems/Wireless Networks and Mobile Computing, 1998 Procee Dings of the 1998 ICPP Workshops on Mineapolis, MN, USA Aug. 14, 1998, Los Alamitos, CA, USA, IEEE Comput. So, Jan. 1, 1998, pp. 95-104, XP010307559.
Chen et al. "Real Time Video and Audio in the World Wide Web," Proceedings of the International Conference on World Wide Web, Dec. 11, 1995, pp. 1-14, XP002107740.
Chaddha, N. Ed—Institute of Electrical and Electronics Engineers "A Software Only Scalable Video Delivery System for Multimedia Applications Over Heterogeneous Networks," Proceedings Fo the International Conference on Image Processing (ICIP), Washington, Oct. 23-26, 1995; [Proceedings of the International Conference on Image Processing (ICIP], Los Alamitos, IEEE Comp. Soc. Press, US, vol. 3, Oct. 23, 1995, pp. 404-407, XP010197207. Tran, N. et al. "Active Adaptation by Program Delegation in Video on Demand," Multimedia Computing and Systems, 1998, Proceedings, IEEE International Conference on Austin, TX, USA, Jun. 28-Jul. 1, 1998, Los Alamitos, CA, USA, IEEE Comput. Soc, US, Jun. 28, 1998, pp. 96-105, XP010291576.
Paravati, G. et al. "A Feedback-Based Control Technique for Interactive Live Streaming Systems to Mobile.Devices," IEEE Transactions on Consumer Electronics, IEEE Service Center, New York, NY, US, vol. 53, No. 1, Feb. 1, 2010, pp. 190-197, XP011306131.

\* cited by examiner

*Primary Examiner* — Joseph Lauture
(74) *Attorney, Agent, or Firm* — Ingrassia Fisher & Lorenz, P.C.

(57) ABSTRACT

A player decodes and renders encoded digital data received from an encoder. During processing, the player periodically monitors dropped frames as well as time spent. If the dropped frames are below a minimum, the player determines to signal the encoder to increase bit rate or frame rate by consulting a table. If the player determines to increase bit rate, the player signals accordingly. However, if the player determines to increase frame rate, the player first verifies that the spent time is below a minimum. To the contrary, if the dropped frames are both above the minimum and a first maximum but not a second maximum, the player determines to signal the encoder to decrease bit rate or frame rate by consulting the table and signaling accordingly. However, if the dropped frames are above the second maximum, the player signals the encoder to decrease the frame rate without consulting the table.

20 Claims, 4 Drawing Sheets

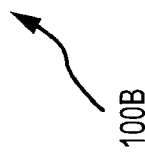
FIG.1B PRE-DEFINED TABLE OF RELATED BIT RATES AND FRAME RATES
| KBPS | 20 | 40 | 60 | 80 | 100 | 120 | 100 | 120 | 140 | 160 | 180 | 200 | 150 | 175 | 200 | 225 | 250 | 275 | 200 | 250 | 300 | 350 | 400 | 450 |
|---|---|---|---|---|---|---|---|---|---|---|---|---|---|---|---|---|---|---|---|---|---|---|---|---|
| FPS | 7 | | | | | | 10 | | | | | | 15 | | | | | | 30 | | | | | |

DYNAMIC ENCODE SETTING ADJUSTMENT

FIELD OF THE INVENTION

This disclosure relates generally to digital data, and more specifically to dynamically adjusting encoder settings for encoding digital data based on monitoring of the decoding of the digital data.

SUMMARY

The present disclosure discloses systems, methods, and computer program products for dynamic code setting adjustment. A player device may decode and render encoded digital data received from an encoder. During decoding and rendering, the player device may periodically monitor the number of dropped frames as well as the time spent decoding and/or rendering. If the dropped frames are below a minimum, the player device may consult a pre-defined table to determine whether to signal the encoder to increase the bit rate or the frame rate for encoding subsequent portions of the digital data. If the player device determines to increase the bit rate, the player device may signal the encoder accordingly. However, if the player device determines to increase the frame rate, the player device may verify that the decoding and/or rendering time is below a minimum time value prior to signaling the encoder to increase the frame rate.

To the contrary, if the dropped frames are above the minimum and above a first maximum but below a second maximum, the player device may consult the pre-defined table to determine whether to signal the encoder to decrease the bit rate or the frame rate. The player may then signal the encoder to decrease the bit rate or the frame rate accordingly. However, if the dropped frames are above the second maximum, the player device may signal the encoder to decrease the frame rate without consulting the pre-defined table.

Further, if the dropped frames are above the minimum but are not above the first maximum, the player device may decide not to signal the encoder to increase or decrease the bit rate or the frame rate.

Additionally, the player device may signal the encoder to modify other encoding properties based on the monitoring other than bit rate and frame rate. These other encoding factors may include resolution, encoder profiles, and so on.

It is to be understood that both the foregoing general description and the following detailed description are for purposes of example and explanation and do not necessarily limit the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

FIG. 1B is a diagram illustrating a sample pre-defined table of related bit rates and frame rates.

DETAILED DESCRIPTION OF THE EMBODIMENTS

Figure 1A:
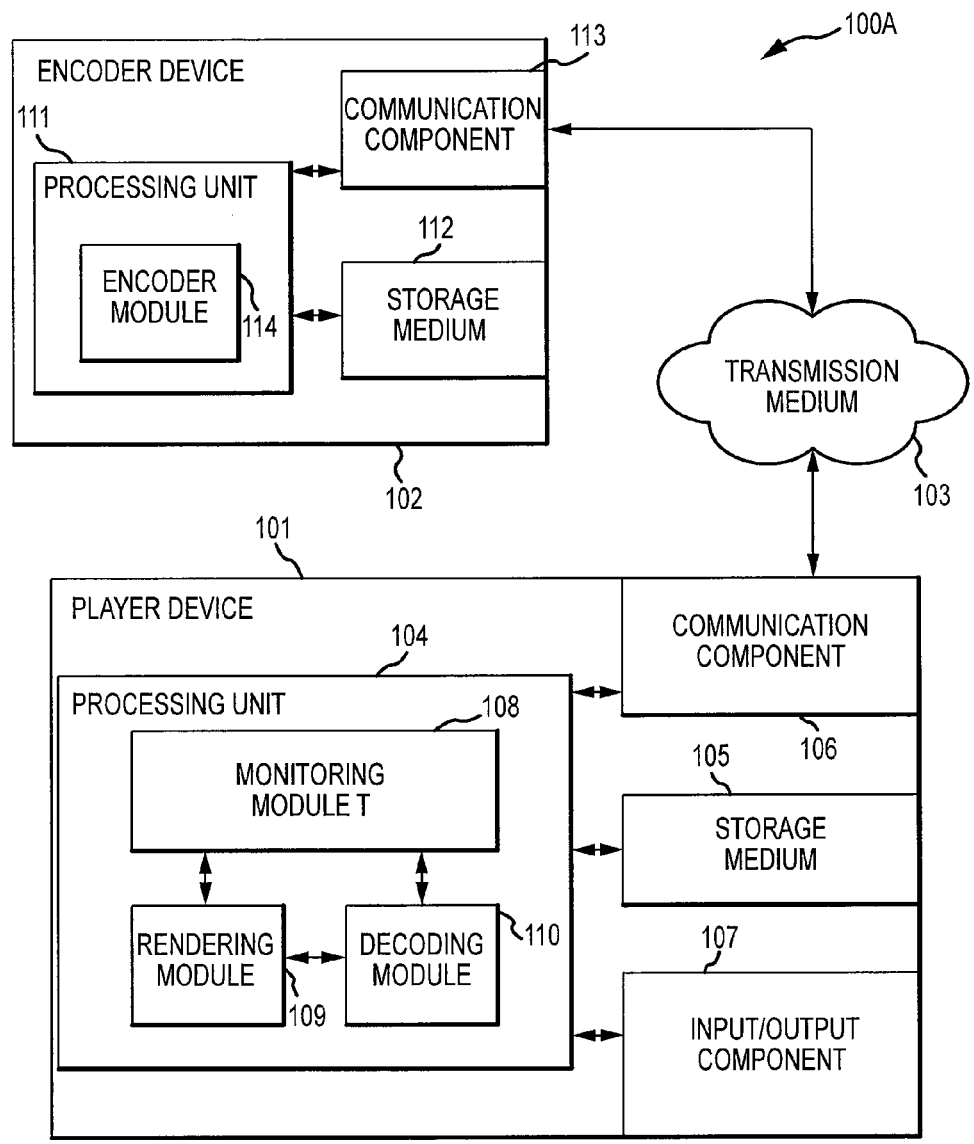
FIG. 1A is a block diagram illustrating a system for dynamic code setting adjustment.

The description that follows includes sample systems, methods, and computer program products that embody various elements of the present disclosure. However, it should be understood that the described disclosure may be practiced in a variety of forms in addition to those described herein.

Digital data transmission systems, such as systems that stream digital video and/or audio content, typically utilize one or more encoders to encode digital data into multiple frames of encoded data in order to reduce the amount of data that must be transmitted, to control the data flow received by a player device, and so on. For example, such a system may utilize an encoder to encode digital video and/or audio utilizing one or more MPEG (Motion Picture Experts Group) encoding standards, ITU-T (Telecommunication Standardization Sector) encoding standards, and so on. Encoders in such a system may encode according to a number of parameters when encoding video and/or audio streams such as bit rate, frame rate, video resolution, audio sample rate, and so on. Generally, the higher such parameters utilized by the encoder to encode video and/or audio streams, the higher quality of the decoded and rendered video and/or audio played by the player device. However, the higher such parameters utilized by the encoder to encode video and/or audio streams, the greater the amount of encoded digital data that must typically be transmitted from the encoder to the player device. If the player device receives more encoded digital data at time than the player device is able to decode and/or render, the player device may drop one or more frames of the encoded digital data. As a result, the video and/or audio played by the player device may appear choppy, incomplete, and so on.

In some digital data transmission systems, the parameters utilized by an encoder to encode digital data may be fixed. However, in other digital data transmission systems, the encoder may begin encoding digital data utilizing default parameter settings and then dynamically adjust the parameters in response to feedback received from the player device. In such systems, the player device may track the number of frames that are dropped during decoding and/or rendering. When the dropped frames rises above a maximum, the player device may request the encoder decrease one or more parameters (such as bit rate, frame rate, resolution, and so on) in order to reduce the number of frames that may be dropped when decoding and/or rendering later portions of the encoded digital data. To the contrary, when the dropped frames falls below a minimum, the player device may request the encoder increase one or more parameters (such as bit rate, frame rate, resolution, and so on) to increase the quality of the video and/or audio played by the player device after decoding and/or rendering later portions of the encoded digital data. As such, the player device may utilize the number of dropped frames as an indicator that the current parameters utilized to encode the digital content are too high and must be lowered to avoid choppy playback, too low and can be increased to improve playback quality, or are appropriately set.

However, the number of dropped frames may not always be a perfect indicator that parameters may be safely increased. Some player devices (particularly mobile computing devices such as cellular telephones, laptop computers, personal digital assistants, tablet computers, and so on) may drop below the minimum number of frames during decoding and rendering of encoded digital content at a particular frame rate. However, when the encoder increases the frame rate due to signals from the player device in response to the low number of frames dropped, a large number of frames may be dropped during decoding and/or rendering. The player device may then signal the encoder to lower the frame rate, which then results in dropped frames below the minimum and signals to the encoder to increase the frame rate again. Thus, the number of dropped frames may not be a sole indicator for when frame rates may be safely increased for such devices, though the number of dropped frames may still be a good indicator for when other parameters may be safely increased, such as bit rates.

Further, the ability of a particular player device to decode and/or render encoded digital data of a particular frame rate may change over time. Under certain circumstances, the particular player device may be able to decode and/or render encoded digital data of the particular frame rate. However, under other circumstances the particular player device may not be able to decode and/or render encoded digital data of the particular frame rate and should not signal an encoder to increase to the particular frame rate regardless how few frames are dropped at the current lower frame rate.

By way of a first example, the particular player device may have a power saving feature that reduces the clock speed of a processing unit when a battery falls below a certain percent charged (such as 50%). In this example, the particular player device may be capable of decoding and/or rendering encoded digital data of the particular frame rate when the processing unit operates at the full clock speed, but not when operating at the reduced clock speed.

By way of a second example, the particular player device may be capable of decoding and/or rendering encoded digital data of the particular frame rate when not executing more than a certain number of software applications, but not when executing a sufficient number of software applications such that sufficient memory, processor, and/or other resources for decoding and/or rendering encoded digital data of the particular frame rate are not available.

By way of a third example, encoded digital data received by the particular player device may vary in complexity, such as between a less complex portion including video of a substantially still newscaster sitting at a desk and a more complex portion including video of an action-filled football game play. The particular player device may be capable of decoding and/or rendering encoded digital data of the particular frame rate containing less complex portion, but not the more complex portion.

Regardless of the specifics, in any of the above examples the particular player device should not signal an encoder to increase to the particular frame rate regardless how few frames are dropped at the current lower frame rate when the situation is such that the particular player device is not capable of decoding and/or rendering encoded digital data of the increased frame rate.

The present disclosure discloses systems, methods, and computer program products for dynamic code setting adjustment. A player device may receive encoded digital data from an encoder. The player device may periodically monitor decoding and rendering of the encoded digital data to track the number of dropped frames during the period as well as the time spent decoding and/or rendering. If the number of dropped frames is below a minimum, the player device may consult a pre-defined table to determine whether to signal the encoder to increase the bit rate or the frame rate used to encode subsequent portions of the digital data. If the player device determines the pre-defined table indicates to increase the bit rate, the player device may signal the encoder to increase the bit rate. However, if the player device determines the pre-defined table indicates to increase the frame rate, the player device may signal the encoder to increase the frame rate if the time spent decoding and/or rendering is below a minimum time value. Otherwise, if the time spent decoding and/or rendering is not below the minimum time value, the player device may skip signaling the encoder to increase the frame rate.

FIG. 1 is a block diagram illustrating a system 100 for dynamic code setting adjustment. The system 100 includes a player device 101 which receives encoded digital data from an encoder device 102 via one or more transmission media 103. The encoded digital video data may be digital video data, digital audio data, a combination of digital video data and digital audio data, and so on. The transmission medium may include any kind of wired or wireless transmission medium such as an Ethernet connection, a satellite connection, a coaxial cable connection, a Wi-Fi™ connection, a Bluetooth™ connection, an infrared connection, an Internet connection, a HomePlug™ connection, a cellular connection, and so on.

The encoder device 102 may include one or more processing units 111, one or more storage media 112 (which may be any non-transitory machine-readable storage media), and one or more communication components 113. The processing unit may execute instructions stored in the storage medium to implement one or more encoder modules 114 to encode digital data and transmit the encoded digital data to the player device via the communication component. For example, the encoder module may include separate modules for encoding video and encoding audio. In some implementations, the encoder device may receive the digital data to encode from one or more other devices, such as one or more content receivers (not shown), one or more content providers (not shown), one or more Internet service providers, and so on.

The player device 101 may include one or more processing units 104, one or more storage media 105 (which may be any non-transitory machine-readable storage media), one or more communication components 106, and one or more input/output components 107. In some implementations, the player device may be a mobile computing device such as a cellular telephone, a laptop computer, a personal digital assistant, a tablet computer, and so on. The processing unit may execute instructions stored in the storage medium to implement one or more monitoring modules 108, one or more rendering modules 109, and one or more decoding modules 110. For example, the decoding module may include separate modules for decoding video and decoding audio. The player device may receive encoded digital data from the encoder device 102 via the communication component 106. The decoding module may decode the encoded digital data. The rendering module may render the digital data decoded by the decoding module. The player device may then play the rendered digital data utilizing the input/output components, such as a display screen and/or speaker.

Periodically, the monitoring module 108 may determine whether or not the parameters utilized to encode the encoded digital content need to be altered. At the expiration of a period of time (which may be a fixed period of time like five seconds, a varying period of time, and so on), the monitoring module may determine the number of frames dropped during decoding and rendering. The monitoring module may be a process which is inactive during the period and is activated at the end of the period. Alternatively, the monitoring module may constantly monitor a clock to determine when the period has expired. In some implementations, the monitoring module may determine the number of dropped frames by querying the rendering module 109 and/or the decoding module 110. The monitoring module may also determine the amount of time per frame spent decoding and rendering during the period. In some implementations, the monitoring module may determine the time spent per frame by querying the rendering module and/or the decoding module. In other implementations, the monitoring module may determine the time spent per frame by querying a process manager, system log, or other mechanism for tracking the processing time the rendering module and/or the decoding module utilized during the period.

The monitoring module 108 may then compare the number of dropped frames to a minimum dropped frame value and one or more maximum dropped frame values. If the number of dropped frames is below the minimum dropped frame value, the monitoring module may consult a pre-defined table of related bit rates and frame rates to determine whether to signal the encoder device 102 to increase the bit rate or the frame rate for subsequent portions of the encoded digital content. Thus, the monitoring module may utilize the number of dropped frames as an indicator that the bit rate or the frame rate of the encoded digital signal is too low and should be increased. Then, if the monitoring module determines by consulting the pre-defined table to increase the bit rate, the monitoring module may signal the encoder device to increase the bit rate for subsequent portions. The monitoring module may signal the encoder utilizing a socket based communication, other inter-process communication, and so on.

However, if the monitoring module determines by consulting the pre-defined table to increase the frame rate, the monitoring module may signal the encoder device to increase the frame rate for subsequent portion only if the amount of time per frame spent decoding and rendering during the period is below a minimum decoding and rendering time value (such as twenty milliseconds per frame). Otherwise, the monitoring module may skip signaling the encoder device to increase the frame rate for subsequent portions even though the monitoring module determined to increase the frame rate because the time spent decoding and rendering is above the minimum decoding and rendering time value.

However, when the monitoring module 108 compares the number of dropped frames to the various values, if the number of dropped frames is greater than both the minimum dropped frame value and a first maximum dropped frame value but not greater than a second maximum dropped frame value, the monitoring module may consult the pre-defined table of related bit rates and frame rates to determine whether to signal the encoder device 102 to decrease the bit rate or the frame rate for subsequent portions of the encoded digital content. Thus, the monitoring module may utilize the number of dropped frames as an indicator that the bit rate or the frame rate of the encoded digital signal is too high and should be decreased. The monitoring module may then signal the encoder device to decrease the bit rate or the frame rate for subsequent portions of the encoded digital content as determined from the pre-defined table.

Further, when the monitoring module 108 compares the number of dropped frames to the various values, if the number of dropped frames is greater than the second maximum dropped frame value, the monitoring module may signal the encoder device 102 to decrease the frame rate for subsequent portions of the encoded digital content without consulting the pre-defined table. Thus, the second maximum dropped frame value may indicate to the monitoring module that the number of dropped frames is significant enough to immediately signal the encoder device to lower the frame rate for subsequent portions of the encoded digital data to avoid significant gaps in playback without first consulting the pre-defined table.

Moreover, when the monitoring module 108 compares the number of dropped frames to the various values, if the number of dropped frames is greater than the minimum dropped frame value but is not greater than the first maximum dropped frame value, the monitoring module may decide not to signal the encoder device 102 to either increase or decrease the bit rate or the frame rate for subsequent portions of the encoded digital data. Thus, the monitoring module may utilize the number of dropped frames as an indicator that the bit rate or the frame rate of the encoded digital signal is adequate and should not be altered.

Figure 2:
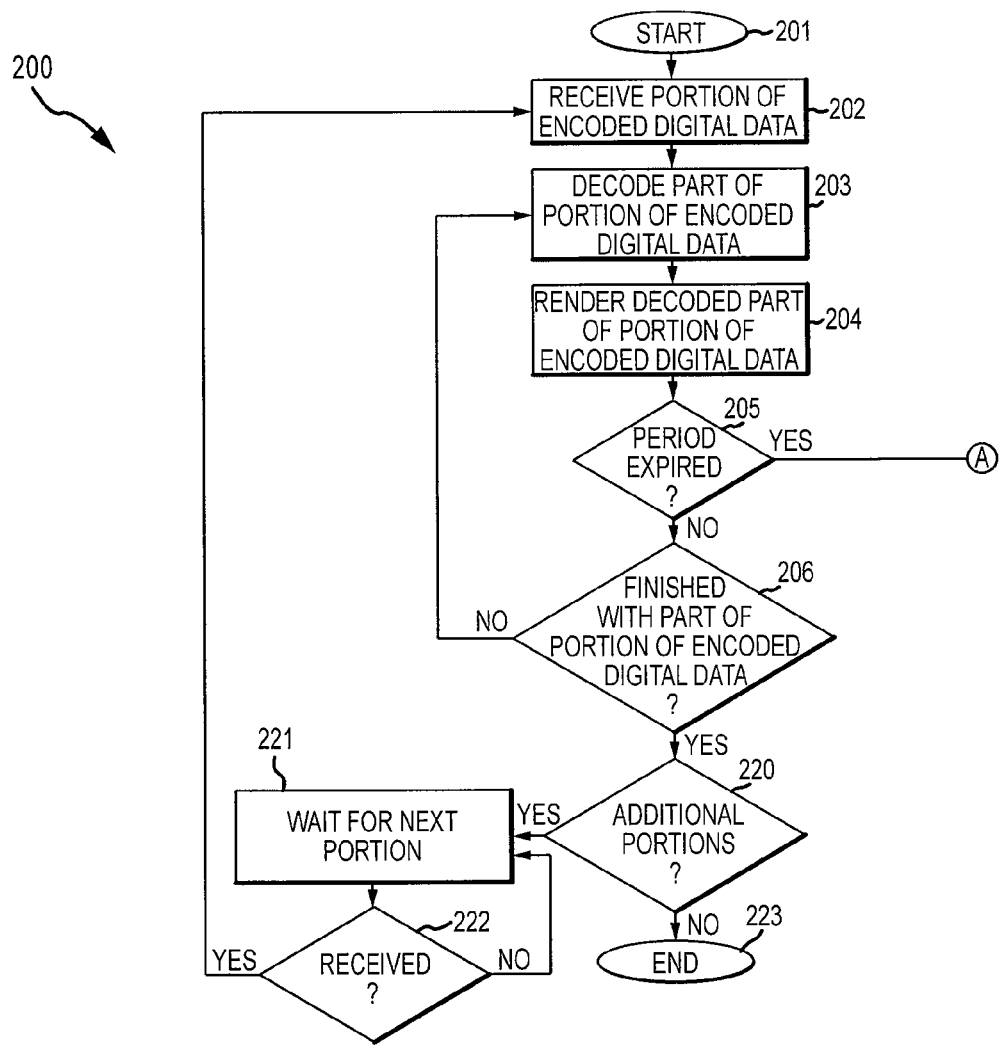
FIGS. 2 and 2A are a flow chart illustrating a method for dynamic code setting adjustment. This method may be performed by the player device of FIG. 1.
Figure 2:
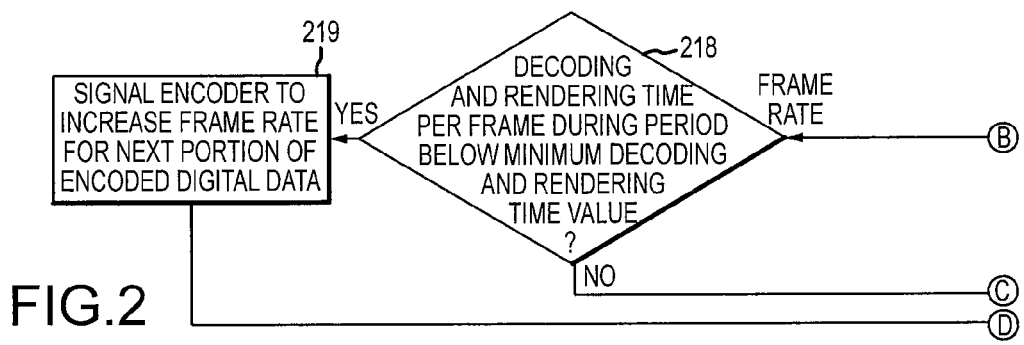
Figure 2A:
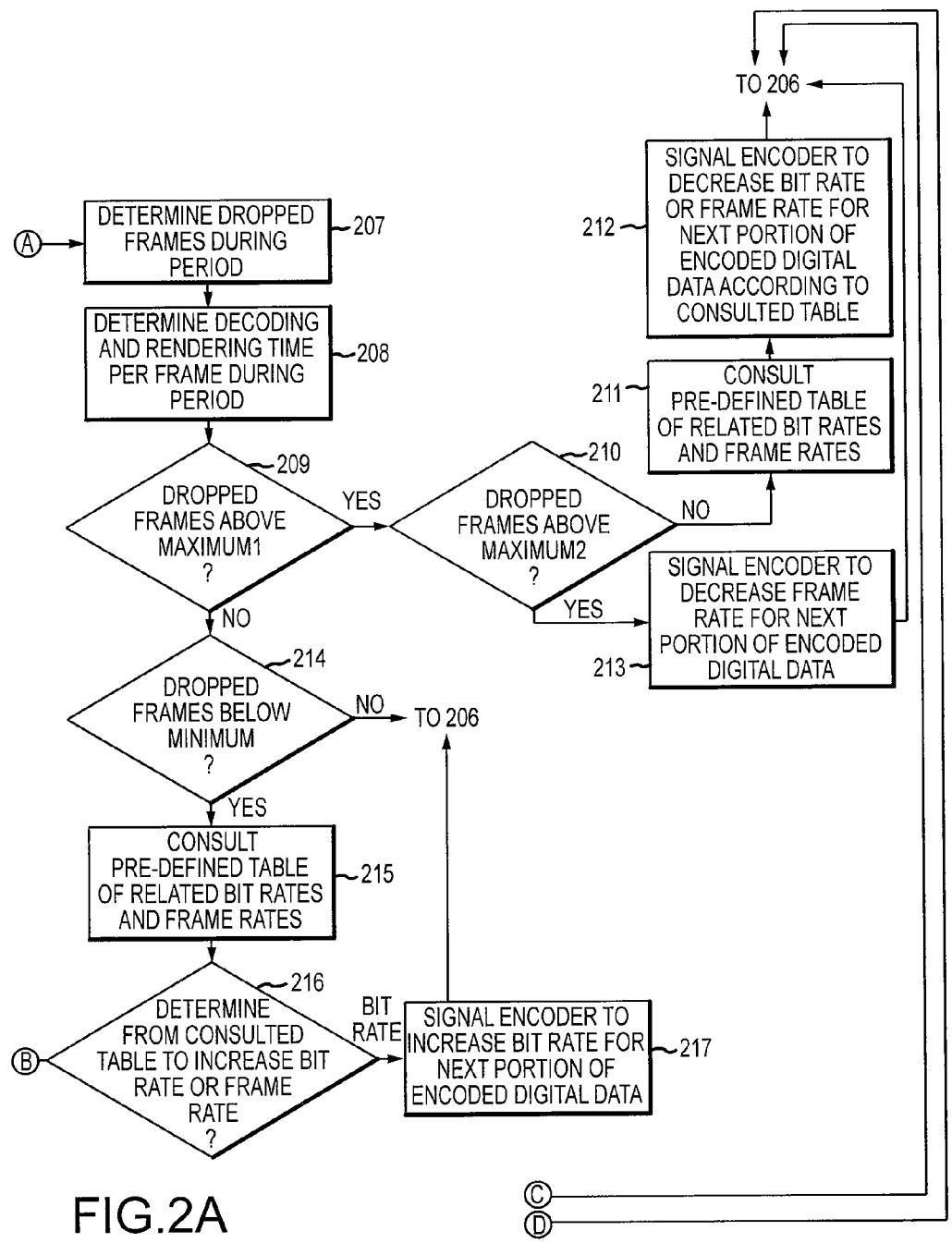

FIGS. 2 and 2A illustrates a method 200 for dynamic code setting adjustment. The method 200 may be performed by the player device 101 of FIG. 1. The flow begins at block 201 and proceeds to block 202 where the player device receives a portion of encoded digital data from the encoder device 102 via the communication component 106. The flow then proceeds to block 203 where the decoding module 110 decodes at least part of the received portion of the encoded digital data. Next, the flow then proceeds to block 204 where the rendering module 109 renders the decoded part of the portion of the encoded digital data.

Then, the flow proceeds to block 205 where the processing unit 104 determines whether or not the period has expired. If so, the flow proceeds to block 207. Otherwise, the flow proceeds to block 206 where the processing unit determines whether or not decoding and rendering of the received portion of the encoded digital data is finished. If so, the flow proceeds to block 220. Otherwise, the flow returns to block 203 where the decoding module continues decoding the received portion of the encoded digital data.

At block 207, after the processing unit 104 determines the period has expired, the monitoring module 108 determines the number of dropped frames during the period and the flow proceeds to block 208. At block 208, the monitoring module determines the decoding and rendering time per frame during the period and the flow proceeds to block 209. At block 209, the monitoring module determines whether or not the number of dropped frames is above a first maximum value. If so, the flow proceeds to block 210. Otherwise, the flow proceeds to block 214.

At block 210, after the monitoring module 108 determines the number of dropped frames is above the first maximum value, the monitoring module determines whether the number of dropped frames is above a second maximum value. If so, the flow proceeds to block 213. Otherwise, the flow proceeds to block 211.

At block 211, after the monitoring module 108 determines the number of dropped frames is not above the second maximum value, the monitoring module consults a pre-defined table of related bit rates and frame rates to determine whether to signal the encoder device 102 to decrease the bit rate or the frame rate for subsequent portions of the encoded digital signal. The flow then proceeds to block 212 where the monitoring module signals the encoder device to decrease the bit rate or the frame rate for subsequent portions of the encoded digital signal according to the consulted pre-defined table. Next, the flow returns to block 206 where the processing unit 104 determines whether or not decoding and rendering of the received portion of the encoded digital data is finished.

At block 213, after the monitoring module 108 determines the number of dropped frames is above the second maximum value, the monitoring module signals the encoder device 102 to decrease the frame rate for subsequent portions of the encoded digital signal without consulting the pre-defined table. Next, the flow returns to block 206 where the processing unit 104 determines whether or not decoding and rendering of the received portion of the encoded digital data is finished.

At block 214, after the monitoring module 108 determines the number of dropped frames is not above the first maximum value, the monitoring module determines whether or not the number of dropped frames is below a minimum value. If so, the flow proceeds to block 215. Otherwise, the flow returns to block 206 where the processing unit 104 determines whether or not decoding and rendering of the received portion of the encoded digital data is finished.

At block 215, after the monitoring module 108 determines the number of dropped frames is below the minimum value, the monitoring module consults a pre-defined table of related bit rates and frame rates to determine whether to signal the encoder device 102 to increase the bit rate or the frame rate for subsequent portions of the encoded digital signal. If the monitoring determines to signal the encoder device to increase the bit rate, the flow proceeds to block 217 where the monitoring module appropriately signals the encoder device before the flow proceeds to block 206 where the processing unit 104 determines whether or not decoding and rendering of the received portion of the encoded digital data is finished. Otherwise, the flow proceeds to block 218.

At block 218, after the monitoring module 108 determines to signal the encoder device 102 to increase the frame rate for subsequent portions of the encoded digital signal, the monitoring module determines whether or not the decoding and rendering time per frame during the period is below a minimum decoding and rendering time value. If so, the flow proceeds to block 219 where the monitoring module appropriately signals the encoder device before the flow proceeds to block 206 where the processing unit 104 determines whether or not decoding and rendering of the received portion of the encoded digital data is finished. Otherwise, the flow proceeds directly from block 218 to block 206.

At block 220, after the processing unit 104 determines decoding and rendering of the received portion of the encoded digital data is finished, the processing unit determines whether or not additional portions of the encoded digital data remain to be received. If so, the flow proceeds to block 221. Otherwise, the flow proceeds to block 223 and ends.

At block 221, after the processing unit 104 determines additional portions of the encoded digital data remain to be received, the processing unit waits for the next portion of the encoded digital data. The flow then proceeds to block 222 where the processing unit determines whether or not the next portion of the encoded digital data has been received. If so, the flow returns to block 202 where the player device 101 receives a portion of encoded digital data from the encoder device 102 via the communication component 106. Otherwise, the flow returns to block 221 where the processing unit waits for the next portion of the encoded digital data.

Returning to FIG. 1, the minimum dropped frame value, first maximum dropped frame value, and the second maximum dropped frame value may be fixed values. For example, the minimum dropped frame value may be zero frames for the period, the first maximum dropped frame value may be 20 frames over the period, and the second maximum dropped frame value may be thirty frames over the period. Alternatively, the various values may vary upon various parameters utilized to encode the encoded digital data, such as a percentage of the frame rate. For example, the minimum dropped frame value may be approximately six percent of the frame rate, such as ten frames dropped over a five second period at a thirty frame per second frame rate.

In some implementations, the rendering module 109 may implement various techniques to reduce the impact of dropped frames. For example, if the rendering module determines during rendering that it will drop a number of frames, the rendering module may drop alternating frames until the number to drop is reached rather than dropping a series of frames equal to that number. This technique may reduce the significance of dropped frames during play of the rendered digital data by splitting up the missing portions into smaller, less noticeable sections.

FIG. 1B illustrates a sample pre-defined table of related bit rates and frame rates that may be utilized by the monitoring module 108. As illustrated, the sample pre-defined table includes a number of frame rate entries and a number of associated bit rate entries. Each of the frame rate entries includes a frame rate and the frame rate entries are ordered according to the value of the frame rate included in each entry. Each of the associated bit rate entries includes a number of bit rates ordered according to the value of the individual bit rate. Thus, as illustrated, the sample pre-defined table includes frame rate entries that include frame rates of 7, 10, 15, and 30. Also as illustrated, the bit rate entry associated with the frame rate entry with the frame rate of 7 includes the bit rates 20, 40, 60, 80, 100, and 120.

The monitoring module 108 may consult the sample pre-defined table to determine whether to increase bit rate or frame rate of the subsequent portions of the encoded digital data by locating the bit rate and the frame rate utilized to encode the current portion of the encoded digital data. If there is a higher bit rate than the current bit rate in the bit rate entry associated with the frame rate entry having the value of the current frame rate, the monitoring module may determine to signal the encoder device 102 to increase the bit rate to the higher bit rate. For example, if the current bit rate is 200 kbps and the current frame rate is 15 fps, the monitoring module may determine to signal the encoder device to increase the bit rate to 225 kpbs.

However, if there is not a higher bit rate in the bit rate entry associated with the frame rate entry with the value of the current frame rate, the monitoring module 108 may determine to signal the encoder device 102 to increase the frame rate to the value of the next highest frame rate entry. In signaling the encoder device to increase the frame rate to the value of the next highest frame rate entry, the monitoring module may also alter the bit rate to the bit rate in the bit rate entry associated with the next highest frame rate entry that occupies the same position as the current bit rate.

For example, if the current bit rate is 275 kbps and the current frame rate is 15 fps, the monitoring module may signal the encoder device to increase the frame rate to 30 fps. Further, the monitoring module may signal the encoder device to increase the bit rate to 450 kbps in addition to increasing the frame rate to 30 fps, as the bit rate 450 occupies the same position in the bit rate entry associated with the frame rate entry with the value 30 fps as the bit rate 275 occupies in the bit rate entry associated with the frame rate entry with the value 15 fps. Of course the monitoring module may only signal the encoder device to increase the frame rate to 30 fps if the decoding and rendering time per frame during the period is below the minimum decoding and rendering time value, even if the monitoring module determines to signal the decoder device to increase the frame rate by consulting the pre-defined table.

Similarly, the monitoring module 108 may consult the sample pre-defined table to determine whether to decrease the bit rate or frame rate of the subsequent portions of the encoded digital data by locating the bit rate and the frame rate utilized to encode the current portion of the encoded digital data. If there is a lower bit rate than the current bit rate in the bit rate entry associated with the frame rate entry having the value of the current frame rate, the monitoring module may determine to signal the encoder device 102 to decrease the bit rate to the lower bit rate. For example, if the current bit rate is 200 kbps and the current frame rate is 15 fps, the monitoring module may determine to signal the encoder device to decrease the bit rate to 175 kpbs.

However, if there is not a lower bit rate in the bit rate entry associated with the frame rate entry with the value of the current frame rate, the monitoring module 108 may determine to signal the encoder device 102 to decrease the frame rate to the value of the next lowest frame rate entry. In signaling the encoder device to decrease the frame rate to the value of the next lowest frame rate entry, the monitoring module may also alter the bit rate to the bit rate in the bit rate entry associated with the next lowest frame rate entry that occupies the same position as the current bit rate.

For example, if the current bit rate is 150 kbps and the current frame rate is 15 fps, the monitoring module may signal the encoder device to decrease the frame rate to 10 fps. Further, the monitoring module may signal the encoder device to decrease the bit rate to 100 kbps in addition to decreasing the frame rate to 10 fps, as the bit rate 100 occupies the same position in the bit rate entry associated with the frame rate entry with the value 10 fps as the bit rate 150 occupies in the bit rate entry associated with the frame rate entry with the value 15 fps.

In the present disclosure, the methods disclosed may be implemented as sets of instructions or software readable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a non-transitory machine-readable medium having stored thereon instructions, which may be used to program a computer system (or other electronic devices) to perform a process according to the present disclosure. A non-transitory machine-readable medium includes any mechanism for storing information in a form (e.g., software, processing application) readable by a machine (e.g., a computer). The non-transitory machine-readable medium may take the form of, but is not limited to, a: magnetic storage medium (e.g., floppy diskette, video cassette, and so on); optical storage medium (e.g., CD-ROM); magneto-optical storage medium; read only memory (ROM); random access memory (RAM); erasable programmable memory (e.g., EPROM and EEPROM); flash memory; and so on.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

The invention claimed is:

1. A method for dynamic encode setting adjustment, the method comprising:
    receiving a first portion of encoded digital data from an encoder utilizing at least one processing unit, wherein the first portion of the encoded digital data is encoded utilizing a bit rate and a frame rate;
    periodically monitoring decoding and rendering of the first portion of the encoded digital data utilizing the at least one processing unit to determine a number of dropped frames during a period of time and a decoding and rendering time per frame during the period of time;
    determining to increase either a bit rate or a frame rate for encoding a second portion of the encoded digital data utilizing the at least one processing unit by consulting a pre-defined table of related bit rates and frame rates when the number of dropped frames during the period of time is less than a minimum dropped frame value; and
    signaling the encoder utilizing the at least one processing unit to increase the frame rate for encoding the second portion of the encoded digital data when said operation of determining determines to increase the frame rate and the decoding and rendering time per frame is below a maximum time per frame value.

2. The method of claim 1, further comprising signaling the encoder utilizing the at least one processing unit to increase the bit rate for encoding the second portion of the encoded digital data when said operation of determining determines to increase the bit rate.

3. The method of claim 1, further comprising:
    deciding to decrease either the bit rate or the frame rate for encoding the second portion of the encoded digital data utilizing the at least one processing unit by consulting the pre-defined table of related bit rates and frame rates when the number of dropped frames during the period of time is greater than a first maximum dropped frame value and not greater than a second maximum dropped frame value;
    signaling the encoder utilizing the at least one processing unit to decrease the bit rate for encoding the second portion of the encoded digital data when said operation of deciding decides to decrease the bit rate; and
    signaling the encoder utilizing the at least one processing unit to decrease the frame rate for encoding the second portion of the encoded digital data when said operation of deciding decides to decrease the frame rate.

4. The method of claim 3, further comprising signaling the encoder utilizing the at least one processing unit to decrease the frame rate for encoding the second portion of the encoded digital data when the number of dropped frames during the period of time is greater than the second maximum dropped frame value.

5. The method of claim 1, wherein the pre-defined table of related bit rates and frame rates includes at least a plurality of frame rate entries and associated bit rate entries, each of the plurality of frame rate entries includes a frame rate, the plurality of frame rate entries are ordered according to values of the frame rate included in each respective frame rate entry, and each of the bit rate entries includes a plurality of bit rates ordered according to value.

6. The method of claim 5, wherein said operation of determining further comprises:
    determining to increase the bit rate for encoding the second portion of the encoded digital data when a bit rate entry associated with one of the plurality of frame rate entries that includes a frame rate corresponding to the frame rate of the first portion of the encoded digital data includes a bit rate with a higher value than the bit rate of the first portion of the encoded digital data; and determining to increase the frame rate for encoding the second portion of the encoded digital data when the bit rate entry associated with the one of the plurality of frame rate entries that includes the frame rate corresponding to the frame rate of the first portion of the encoded digital data does not include a bit rate with a higher value than the bit rate of the first portion of the encoded digital data.

7. The method of claim 1, further comprising deciding not signal the encoder to increase either the bit rate or the frame rate for encoding the second portion of the encoded digital data or decrease either the bit rate or the frame rate for encoding the second portion of the encoded digital data when the number of dropped frames during the period of time is not less than the minimum dropped frame value and is not greater than a maximum dropped frame value.

8. The method of claim 1, further comprising skipping signaling the encoder to increase the frame rate for encoding the second portion of the encoded digital data when said operation of determining determines to increase the frame rate and the decoding and rendering time per frame is not below the maximum time per frame value.

9. The method of claim 1, wherein the encoded digital data comprises at least digital video data.

10. The method of claim 1, further comprising:
decoding the first portion of the encoded digital data utilizing the at least one processing unit; and
rendering the decoded first portion of the encoded digital data utilizing the at least one processing unit, wherein said operation of rendering comprises:
determining to drop a number of frames of the decoded first portion of the encoded digital data; and
dropping alternating frames of the decoded first portion of the encoded digital data until the number of frames is reached.

11. A player device, comprising:
at least one communication component that receives a first portion of encoded digital data from an encoder, wherein the first portion of the encoded digital data is encoded utilizing a bit rate and a frame rate;
at least one non-transitory storage medium; and
at least one processing unit, coupled to the at least one communication component and the at least one non-transitory storage medium, that executes code stored in the at least one non-transitory storage medium to implement a decoder module, a rendering module, and a monitoring module;
wherein the monitoring module:
periodically ascertains:
a number of dropped frames during a period of time by monitoring frames dropped by the decoder module in decoding the first portion of the encoded digital data and frames dropped by the rendering module in rendering the decoded first portion of the encoded digital data, and
a decoding and rendering time per frame during the period of time by monitoring time spent by the decoding module in decoding the first portion of the encoded digital data and time spent by the rendering module in rendering the decoded first portion of the encoded digital data;

determines to increase either a bit rate or a frame rate for encoding a second portion of the encoded digital data by consulting a pre-defined table of related bit rates and frame rates stored in the at least one non-transitory storage medium when the number of dropped frames during the period of time is less than a minimum dropped frame value; and signals the encoder utilizing the at least one communication component to increase the frame rate for encoding the second portion of the encoded digital data when the monitoring module determines to increase the frame rate and the decoding and rendering time is below a maximum time per frame value.

12. The player device of claim 11, wherein the monitoring module signals the encoder utilizing the at least one communication component to increase the bit rate for encoding the second portion of the encoded digital data when the monitoring module determines to increase the bit rate.

13. The player device of claim 11, wherein the monitoring module determines to decrease either a bit rate or a frame rate for encoding the second portion of the encoded digital data by consulting a pre-defined table of related bit rates and frame rates stored in the at least one non-transitory storage medium when the number of dropped frames during the period of time is greater than a first maximum dropped frame value and not greater than a second maximum dropped frame value and wherein the monitoring module signals the encoder accordingly utilizing the at least one communication component.

14. The player device of claim 13, wherein the monitoring module signals the encoder to decrease the frame rate for the second portion of the encoded digital data utilizing the at least one communication component when the number of dropped frames during the period of time is greater than the second maximum dropped frame value.

15. The player device of claim 11, wherein the pre-defined table of related bit rates and frame rates includes at least a plurality of frame rate entries and associated bit rate entries, each of the plurality of frame rate entries includes a frame rate, the plurality of frame rate entries are ordered according to values of the frame rate included in each respective frame rate entry, and each of the bit rate entries includes a plurality of bit rates ordered according to value.

16. The player device of claim 15, wherein the monitoring module determines to increase the bit rate for encoding the second portion of the encoded digital data by consulting the pre-defined table of related bit rates and frame rates when a bit rate entry associated with one of the plurality of frame rate entries that includes a frame rate corresponding to the frame rate of the first portion of the encoded digital data includes a bit rate with a higher value than the bit rate of the first portion of the encoded digital data.

17. The player device of claim 15, wherein the monitoring module determines to increase the frame rate for encoding the second portion of the encoded digital data by consulting the pre-defined table of related bit rates and frame rates when the bit rate entry associated with the one of the plurality of frame rate entries that includes the frame rate corresponding to the frame rate of the first portion of the encoded digital data does not include a bit rate with a higher value than the bit rate of the first portion of the encoded digital data.

18. The player device of claim 11, wherein the rendering module determines to drop a number of frames of the decoded first portion of the encoded digital data during rendering and drops alternating frames of the decoded first portion of the encoded digital data until the number of frames is reached.

19. The player device of claim 11, wherein the player device comprises a mobile computing device.

20. A computer program product, comprising:
a first set of instructions, stored in at least one non-transitory machine-readable medium, executable by at least one processing unit to receive a first portion of encoded digital data from an encoder, wherein the first portion of the encoded digital data is encoded utilizing a bit rate and a frame rate;
a second set of instructions, stored in the at least one non-transitory machine-readable medium, executable by the at least one processing unit to periodically monitor decoding and rendering of the first portion of the encoded digital data to determine a number of dropped frames during a period of time and a decoding and rendering time per frame during the period of time;
a third set of instructions, stored in the at least one non-transitory machine-readable medium, executable by the at least one processing unit to determine to increase either a bit rate or a frame rate for encoding a second portion of the encoded digital data by consulting a predefined table of related bit rates and frame rates when the number of dropped frames during the period of time is less than a minimum dropped frame value; and
a fourth set of instructions, stored in the at least one non-transitory machine-readable medium, executable by the at least one processing unit to signal the encoder to increase the frame rate for encoding the second portion of the encoded digital data when said operation of determining determines to increase the frame rate and the decoding and rendering time per frame is below a maximum time per frame value.

* * * * *